(12) United States Patent
Liao et al.

(10) Patent No.: US 10,320,352 B1
(45) Date of Patent: Jun. 11, 2019

(54) CLASS-D AMPLIFIER WITH DUTY CYCLE CONTROL

(71) Applicant: Texas Instruments Incorporated, Dallas, TX (US)

(72) Inventors: Jianquan Liao, Shanghai (CN); Xiuyuan Wang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/928,447

(22) Filed: Mar. 22, 2018

Related U.S. Application Data (63) Continuation of application No. PCT/CN2017/112301, filed on Nov. 22, 2017.

(51) Int. Cl.
| | | |
|---|---|---|
| *H03G 3/30* | (2006.01) | |
| *H03F 3/217* | (2006.01) | |
| *H03F 3/187* | (2006.01) | |
| *H03K 3/017* | (2006.01) | |
| *H03K 5/24* | (2006.01) | |
| *H03F 3/213* | (2006.01) | |

(52) U.S. Cl.
CPC ........... *H03G 3/3021* (2013.01); *H03F 3/187* (2013.01); *H03F 3/213* (2013.01); *H03F 3/217* (2013.01); *H03K 3/017* (2013.01); *H03K 5/24* (2013.01); *H03F 2200/03* (2013.01); *H03F 2200/351* (2013.01)

(58) Field of Classification Search
CPC .. H03F 3/217; H03F 1/0205; H03F 2200/351; H03F 2200/03

USPC ..................... 381/120; 330/251, 127; 333/32
See application file for complete search history.

(56) References Cited

U.S. PATENT DOCUMENTS

| | | | |
|---|---|---|---|
| 7,170,266 B1 | 1/2007 | Seven et al. | |
| 2009/0315623 A1 | 12/2009 | Dooper et al. | |
| 2014/0285258 A1 | 9/2014 | Du et al. | |
| 2015/0109056 A1* | 4/2015 | Lesso | H03F 1/0211 330/251 |
| 2015/0214902 A1* | 7/2015 | Lin | H03F 1/3205 330/251 |

OTHER PUBLICATIONS

International Search Report in corresponding PCT Patent Application No. PCT/CN2017/112301, dated Aug. 31, 2018 (4 pages).

* cited by examiner

*Primary Examiner* — Melur Ramakrishnaiah
(74) *Attorney, Agent, or Firm* — John R. Pessetto; Charles A. Brill; Frank D. Cimino (57) ABSTRACT

A class-D amplifier includes an output driver, a pulse width modulator, an integrator, and duty cycle control circuitry. The output driver is configured to drive a loudspeaker. The pulse width modulator is coupled to the output driver. The integrator is coupled to the pulse width modulator. The duty cycle control circuitry is coupled to the integrator. The duty cycle control circuitry is configured to monitor amplitude of output signal of the integrator, and change an average duty cycle of signal at an output of the output driver as a function of the amplitude.

4 Claims, 6 Drawing Sheets

CLASS-D AMPLIFIER WITH DUTY CYCLE CONTROL

BACKGROUND

Class-D audio amplifiers are switch mode amplifiers that switch at a high frequency to produce a rectangular waveform at the amplifier's output. Class-D amplifiers may be much more efficient than linear audio amplifiers, and as a result may employ smaller power supplies and eliminate heat sinks. Accordingly, class-D amplifiers may significantly reduce overall system cost, size, and weight relative to linear amplifiers of equivalent power.

Some class-D amplifiers use a pulse width modulator (PWM) to generate pulses that vary in width with the audio signal's amplitude. The pulses may switch output transistors of the amplifier at a fixed or variable frequency. Some class-D amplifiers may rely upon other types of pulse modulators, such as pulse density modulators. The rectangular waveform generated by the class-D amplifier is generally filtered to remove the high-frequency carrier waveform and reconstruct the audio waveform, which can be used to drive a loudspeaker and produce sound.

SUMMARY

A class-D audio amplifier that is controllable to provide a range of operational efficiency without an increase in total harmonic distortion is disclosed herein. In one embodiment, a class-D amplifier includes an output driver, a pulse width modulator, an integrator, and duty cycle control circuitry. The output driver is configured to drive a loudspeaker. The pulse width modulator is coupled to the output driver. The integrator is coupled to the pulse width modulator. The duty cycle control circuitry is coupled to the integrator. The duty cycle control circuitry is configured to monitor amplitude of output signal of the integrator, and change an average duty cycle of signal at an output of the output driver as a function of the amplitude.

In another embodiment, an audio amplifier integrated circuit includes an output driver, a pulse width modulator, an integrator, and duty cycle control circuitry. The output driver is configured to drive a speaker coil. The pulse width modulator is configured to generate a pulse signal that is provided to an input of the output driver. The integrator is configured to generate an audio signal to be modulated by the pulse width modulator. The duty cycle control circuitry is configured to monitor amplitude of the audio signal generated by the integrator, and to determine, based on the amplitude, a selected average duty cycle of an output signal to be produced at an output of the output driver. The duty cycle control circuitry is also configured to generate a control signal that causes the integrator to adjust the average duty cycle of the output signal to the selected average duty cycle.

In a further embodiment, an integrated circuit includes a class-D audio amplifier. The class-D audio amplifier includes an output driver, a pulse width modulator, an integrator, and duty cycle control circuitry. The output driver is configured to drive a loudspeaker. The pulse width modulator is configured to provide input to the output driver. The integrator is configured to provide input to the pulse width modulator. The duty cycle control circuitry is coupled to the integrator. The duty cycle control circuitry includes thresholding circuitry, a state machine, and duty cycle adjustment circuitry. The thresholding circuitry includes a first comparator and a second comparator. The first comparator is coupled to an output of the integrator. The first comparator is configured to compare the amplitude to a first threshold value. The second comparator is coupled an output of the integrator. The second comparator is configured to compare the amplitude to a second threshold value. The first threshold is higher than the second threshold. The state machine is coupled to the thresholding circuitry and configured to determine, based on outputs of the first comparator and the second comparator, whether an average duty cycle of signal at an output of the output driver is to be changed. The duty cycle adjustment circuitry is coupled to the state machine and configured to change the average duty cycle based on an output of the state machine.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of additional factors.

In conventional class-D amplifiers for driving a bridge tied load, while the instantaneous duty cycle of the amplifier output signal changes with input signal amplitude, the average duty cycle of the amplifier output signal is fixed at 50% for all input signal levels. The average duty cycle may be defined as one-half the sum of the duty cycle of signal at each speaker output of the bridge. Common mode voltage at the amplifier output is directly related to the average output duty cycle of the amplifier (e.g., output common mode voltage=average duty cycle×driver power supply voltage). Unfortunately, operating with a fixed 50% average duty cycle results in substantial power loss at idle signal levels when driving an L-C filter due to the high common mode voltage. To decrease power loss, conventional class-D amplifiers include larger L-C filters that increase system cost and circuit area. Operating with a low average duty cycle decreases power loss at idle signal levels by decreasing the common mode voltage, but when output power is high a low average duty cycle results in clipping that increases total harmonic distortion.

Embodiments of the present disclosure include a class-D amplifier that controls the average output duty cycle (and output common mode voltage) based on signal level. If input signal level is high, the average duty cycle of signal at the amplifier output may be set to 50%. Embodiments decrease the average output duty cycle as the input signal level decreases. For example, if the input signal is idle, then the average duty cycle of amplifier output signal may be set to 10%, 15%, etc. By changing the average output duty cycle (and the output common mode voltage) based on signal level, embodiments of the class-D amplifier disclosed herein can decrease current ripple in the output inductor and decrease power loss, thereby improving overall amplifier power efficiency. Embodiments also include circuitry to suppress pops and clicks while adjusting the average duty cycle of amplifier output. Embodiments are suitable for implementation in class-D amplifier integrated circuits.

Figure 1:
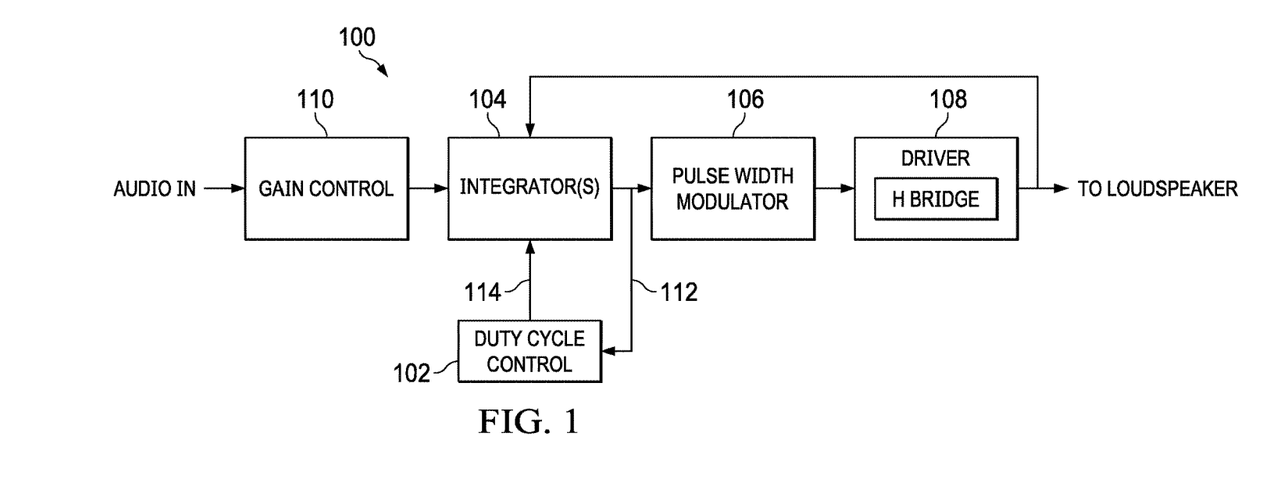
FIG. 1 shows a block diagram for a class-D amplifier with duty cycle control in accordance with various embodiments.

FIG. 1 shows a block diagram for a class-D amplifier 100 with duty cycle control in accordance with various embodiments. The amplifier 100 includes gain control circuitry 110, an integrator(s) 104, a pulse width modulator 106, an output driver 108, and duty cycle control circuitry 102. Embodiments of the class-D amplifier 100 may be implemented in an integrated circuit. The gain control circuitry 110 sets the gain applied to an audio input signal. The gain control circuitry 110 may include selectable or variable resistances that can be controlled to set an amount of gain to be applied to the audio input signal. For example, resistance included in the gain control circuitry 110 may be selectable to apply 20 decibels (dB), 26 dB, 32 dB, 36 dB, or other gain value to the audio input signal. In some embodiments, the gain control circuitry 110 may operate in conjunction with the integrator(s) 104 to provide the selected gain.

The integrator(s) 104 combine the audio input signal with feedback from the output of the driver 108 to suppress errors introduced into the output drive signal and improve total harmonic distortion of the amplifier 100. The integrator(s) 104 may include a number of sequentially connected integrator stages. For example, the integrator(s) 104 may include a first integration stage and a second integrator stage, where the output of the first integration stage is coupled to the input of the second integration stage. Output of the integrator(s) 104 is provided to the pulse width modulator 106.

The pulse width modulator 106 outputs a stream of pulses that represent the amplitude of the signal received from the integrator(s) 104. The pulse width modulator 106 may include a reference wave generator (e.g., a triangle wave or ramp wave generator) and a comparator. The comparator may compare the amplitude of the reference wave to the amplitude of the signal received from the integrator(s) 104. The result of the comparison is a series of pulses that represent the amplitude of the signal received from the integrator(s) 104. The output of the pulse width modulator 106 is provided to the driver 108

The driver 108 includes power transistors (e.g., power metal oxide semiconductor field effect transistors) that drive a loudspeaker. The driver 108 may also include gate driver circuitry to drive the gate capacitance of the power transistors. In some embodiments, transistors of the driver 108 may form a bridge (e.g., an H-bridge). The loudspeaker may be connected across the bridge (e.g., across two loudspeaker drive terminals of the H-bridge). The output of the driver 108 is also fed back to the integrator(s) 104 for error suppression.

The duty cycle control circuitry 102 is coupled to the integrator(s) 104. The duty cycle control circuitry 102 monitors the output of the integrator(s) 104 to determine the amplitude of the audio signal provided to the pulse width modulator 106. Based on the amplitude of the output signal generated by the integrator(s) 104, the duty cycle control circuitry 102 generates a control signal that causes the integrator(s) output to change the average duty cycle of the drive signals at the output of the driver 108. For example, a high amplitude output signal generated by the integrator(s) 104 may cause the duty cycle control circuitry 102 to generate a control signal that causes the integrator(s) 104 to produce a 50% duty cycle at the output of the driver 108. Similarly, a low amplitude output signal generated by the integrator(s) 104 may cause the duty cycle control circuitry 102 to generate a control signal that causes the integrator(s) 104 to produce a 10% or 15% average duty cycle at the output of the driver 108. By generating a low average duty cycle output while audio signal amplitude is low and a high average duty cycle output while audio signal amplitude is high, the amplifier 100 provides higher efficiency than conventional class-D amplifiers that employ a fixed duty cycle. In some embodiments, the duty cycle control circuitry 102 may change the average duty cycle of the driver output by changing a common mode offset voltage in the output of the integrator(s) 104. The average duty cycle of the driver output may be an average of a duty cycle of signal produced at a first loudspeaker drive terminal of the H-bridge and a signal produced at a second loudspeaker drive terminal of the H-bridge.

The duty cycle control circuitry 102 may also include circuitry to control the transition between different average duty cycle values to avoid transients, such as pops and/or clicks, in the audio output. For example, such circuitry may cause the average duty cycle to change gradually at a rate that alleviates transients. To avoid clipping when audio signal amplitude increases, transition from a low average duty cycle to a high average duty cycle may be provided at a higher rate than transition from a high average duty cycle to a low average duty cycle.

Figure 2:
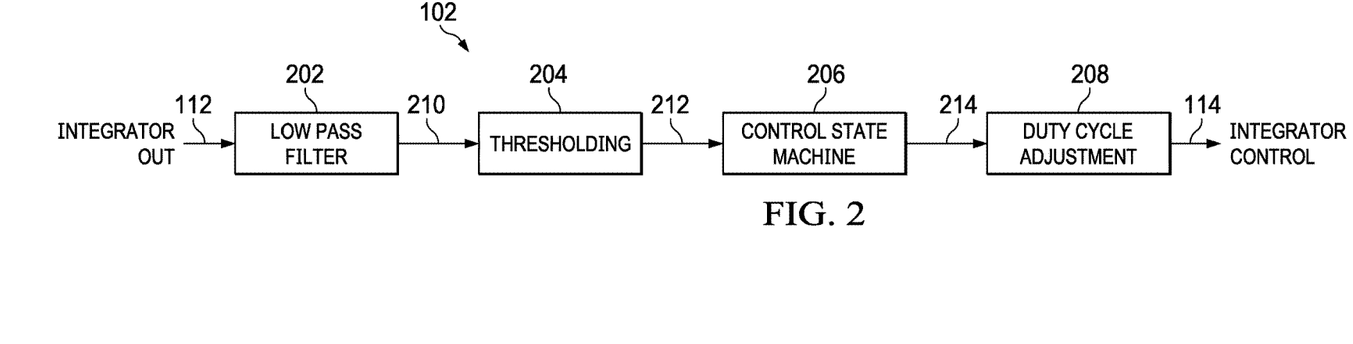
FIG. 2 shows a block diagram of duty cycle control circuitry suitable for use in a class-D amplifier in accordance with various embodiments.

FIG. 2 shows a block diagram of the duty cycle control circuitry 102 in accordance with various embodiments. The duty cycle control circuitry 102 includes a low pass filter 202, thresholding circuitry 204, a control state machine 206, and duty cycle adjustment circuitry 208. The low pass filter 202 attenuates frequencies that exceed the audio signal range, such as frequencies introduced by feedback of output of the driver 108. For example, the low pass filter 202 may attenuate frequencies greater than 20 kilohertz with a roll off of 6 dB per octave, 12 dB per octave, etc. The output 210 of the low pass filter 202 is provided to the thresholding circuitry 204.

The thresholding circuitry 204 compares the amplitude of the low pass filtered audio signal to one or more thresholds. Each threshold may define the amplitude at which transition from one average duty cycle to another is initiated. The thresholding circuitry 204 may include a comparator that compares each threshold voltage to the audio signal. Outputs 212 of the thresholding circuitry 204 are provided to the control state machine 206.

The control state machine 206 determines what average duty cycle should be generated by the class-D amplifier 100 based on the outputs of the thresholding circuitry 206. For example, if the thresholding circuitry 204 indicates that the audio signal amplitude has risen from below to above a predetermined threshold, then the control state machine 206 may determine that the average duty cycle generated by the class-D amplifier 100 should be changed from low to high. Thus, the output of the control state machine 206 specifies an average duty cycle to be generated by the class-D amplifier 100. The duty cycle selection output 214 of the control state machine 206 is provided to the duty cycle adjustment circuitry 208.

The duty cycle adjustment circuitry 208 controls the transition from one average duty cycle to another. Rather than instantaneously changing the average duty cycle from a current value to a desired value, the duty cycle adjustment circuitry 208 gradually changes the average duty cycle in a series of steps. For example, the duty cycle adjustment circuitry 208 may generate a bias voltage that is provided to the integrator(s) 104 as a number of step changes in voltage. In some embodiments of the duty cycle adjustment circuitry 208, the duration of each step may be the same and the voltage of steps may vary to vary the rate of average duty cycle change. The duration of each step, the number of steps, and the duration of time over which the average duty cycle is changed may be controlled by digital and/or analog timing circuitry of the duty cycle adjustment circuitry 208. Similarly, the value of voltage generated for each step may be controlled by analog or digital voltage generators or voltage dividers of the duty cycle adjustment circuitry 208.

Figure 3:
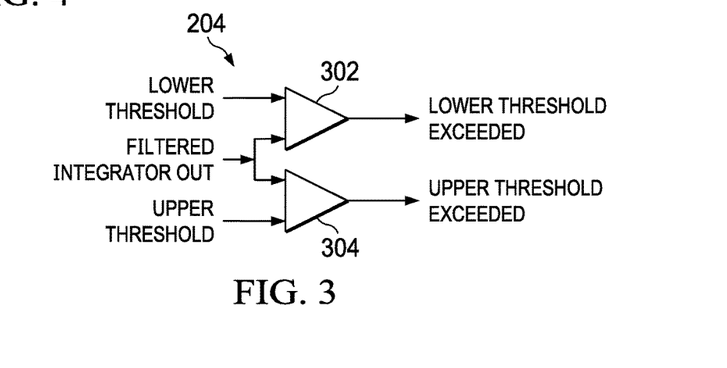
FIG. 3 shows a block diagram of thresholding circuitry suitable for use in controlling duty cycle of a class-D amplifier in accordance with various embodiments.

FIG. 3 shows an embodiment of the thresholding circuitry 204. The embodiment of the thresholding circuitry 204 shown in FIG. 3 includes a first comparator 302 and a second comparator 304. The first comparator 302 compares the audio signal to a lower threshold voltage. The second comparator 304 compares the audio signal to a higher threshold voltage. The outputs of the two comparators 302 and 304 define three amplitude regions and three corresponding average duty cycle values. For example, if the audio amplitude exceeds the upper threshold, then a high average duty cycle may be generated to prevent signal clipping. If the audio amplitude is lower than the lower threshold, then a low average duty cycle may be generated to reduce power loss. If the audio amplitude exceeds the lower threshold and is lower than the upper threshold, then an average duty cycle between the high and low average duty cycles (i.e., an intermediate average duty cycle) may be generated.

Figure 4:
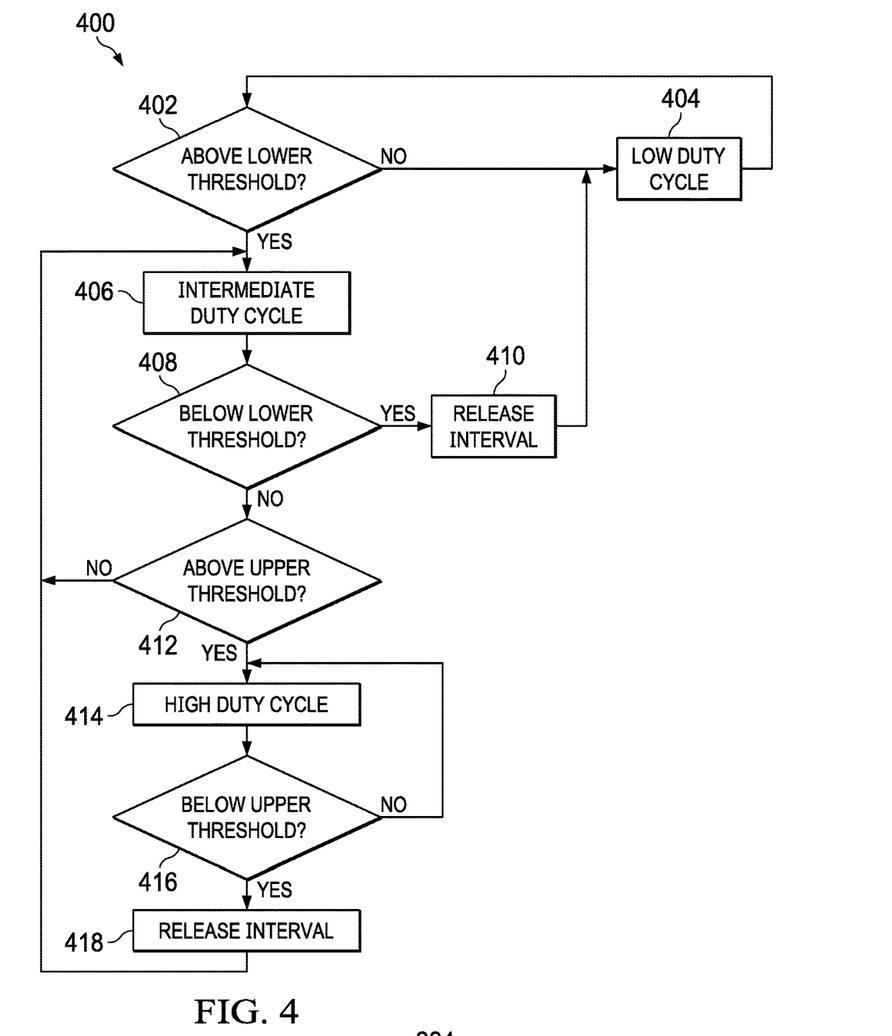
FIG. 4 shows a flow diagram for a method of operating a duty cycle control state machine that controls average duty cycle of output in a class-D amplifier in accordance with various embodiments.

FIG. 4 shows a flow diagram for a method 400 of operating various embodiments of the duty cycle control state machine 206. Though depicted sequentially as a matter of convenience, at least some of the actions shown can be performed in a different order and/or performed in parallel. Additionally, some embodiments may perform only some of the actions shown. Operation of the method 400 is based on comparison of the filtered audio signal 210 to two threshold values by the thresholding circuitry 204.

In block 402, the class-D amplifier 100 is generating a low average duty cycle (10%-15% average duty cycle), and the control state machine 206 determines whether results of the threshold comparisons indicate that the amplitude of the audio signal exceeds the lower threshold. If the amplitude of the audio signal does not exceed the lower threshold, then in block 404, the control state machine 206 determines that a low average duty cycle should be generated. Thereafter, the method 400 proceeds with determining whether results of the threshold comparisons indicate that the amplitude of the audio signal exceeds the lower threshold in block 402.

On the other hand, if in block 402 the results of the threshold comparisons indicate that the amplitude of the audio signal exceeds the lower threshold, then, in block 406, the control state machine 206 determines that an intermediate average duty cycle should be generated and generates control signals to cause the cycle adjustment circuitry 208 to change from a low average duty cycle to an intermediate average duty cycle. An intermediate average duty cycle may be an average duty cycle between the high average duty cycle and low average duty cycle values. For example, a 35% average duty cycle may be an intermediate average duty cycle.

In block 408, the class-D amplifier 100 is generating an intermediate average duty cycle, and the control state machine 206 determines whether results of the threshold comparisons indicate that the amplitude of the audio signal is below the lower threshold. If the amplitude of the audio signal is below the lower threshold, then in block 410 the control state machine 206 generates control signals to cause the cycle adjustment circuitry 208 to change the average duty cycle from intermediate to low in a release time interval. The rate of average duty cycle change in the release time interval may be selected to avoid inducing transients.

If, in block 408, the threshold comparisons indicate that the amplitude of the audio signal exceeds the lower threshold, then, in block 412, the control state machine 206 determines whether results of the threshold comparisons indicate that the amplitude of the audio signal exceeds the upper threshold. If the amplitude of the audio signal is below the upper threshold, then the control state machine 206 maintains the intermediate average duty cycle in block 406. However, if the amplitude of the audio signal exceeds the upper threshold, then the control state machine 206 generates control signals to cause the duty cycle adjustment circuitry 208 to gradually change from an intermediate to a high average duty cycle (e.g., 50%) in block 414. The transition to high average duty cycle may occur over an attack time interval that is shorter than a release time interval (applied to reduce average duty cycle) to prevent clipping caused by an increase in signal amplitude. Accordingly, the rate of average duty cycle change may be higher when increasing average duty cycle than when decreasing average duty cycle.

In block 416, the class-D amplifier 100 is generating a high average duty cycle, and the control state machine 206 determines whether results of the threshold comparisons indicate that the amplitude of the audio signal is lower than the upper threshold. If the amplitude of the audio signal exceeds the upper threshold, then the state machine 206 continues generation of the high average duty cycle in block 414.

If, in block 416, the threshold comparisons indicate that the amplitude of the audio signal has fallen below the upper threshold, then, in block 418, the control state machine 206 generates control signals to cause the duty cycle adjustment circuitry 208 to gradually transition the average duty cycle from high to intermediate during a release time interval. The rate of average duty cycle change in the release time interval may be selected to avoid inducing transients.

Figure 5:
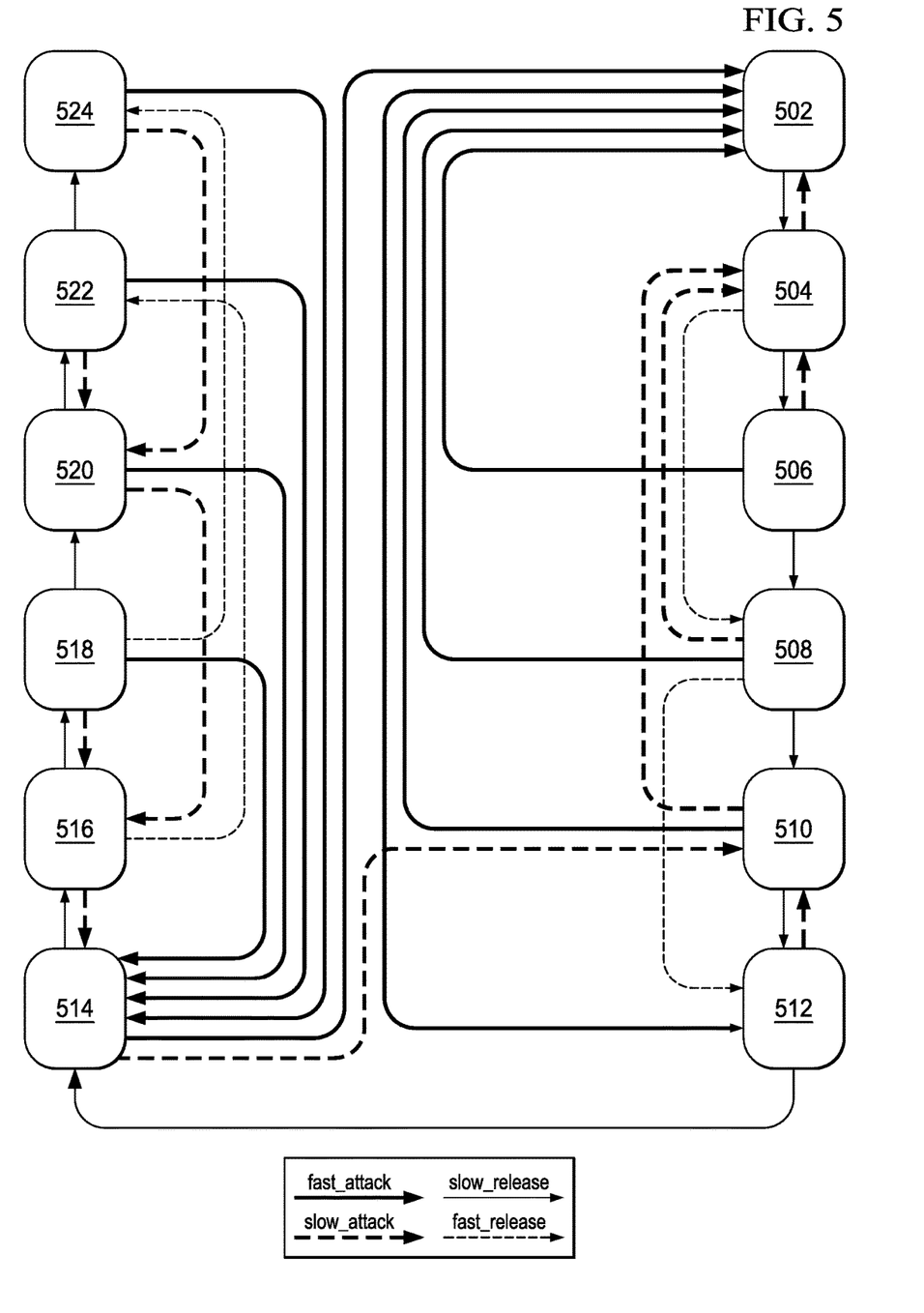
FIG. 5 shows state transitions in duty cycle adjustment circuitry that changes average output duty cycle in a class-D amplifier in accordance with various embodiments.

FIG. 5 shows state transitions in the duty cycle adjustment circuitry 208 in accordance with various embodiments. Block 502 represents generation of a control voltage that causes the integrator(s) 104 to induce a high average duty cycle. Block 524 represents generation of a control voltage that causes the integrator(s) 104 to induce a low average duty cycle. Block 514 represents generation of a control voltage that causes the integrator(s) 104 to induce an intermediate average duty cycle. Transitioning from one block to another produces a step change in the control voltage. In a slow release mode, from the high average duty cycle block 502, the duty cycle adjustment circuitry 208 decreases the average duty cycle by step-wise reducing the average duty cycle over each block 502, 504, 506, 508, 510, 512, 514, 516, 518, 520, and 522 to block 524. In a fast release mode, the duty cycle adjustment circuitry 208 decreases the average duty cycle by step-wise reducing the average duty cycle from block 502 to block 504 to block 508 to block 512 to block 514 to block 516 to block 518 to block 524. Thus, given consistent step duration, the fast release mode allows for transition from low average duty cycle to high average duty cycle in less time and with larger steps than the slow release mode. Some embodiments of the duty cycle adjustment circuitry 208 may transition to low average duty cycle using a different number of steps in a slow or fast attack mode.

The duty cycle adjustment circuitry 208 generally provides for transition from low to high average duty cycle in less time than for transition from high to low average duty cycle. In a slow attack mode, the duty cycle adjustment circuitry 208 increases the average duty cycle by step-wise increasing the duty cycle from block 524 to block 520 to block 516 to block 514 to block 510 to block 514 to block 502. In a fast attack mode, the duty cycle adjustment circuitry 208 increases the average duty cycle by step-wise increasing the average duty cycle from block 524 to block 514 to block 502. Some embodiments of the duty cycle adjustment circuitry 208 may transition to high average duty cycle using a different number of steps in a slow or fast attack mode.

Figure 6:
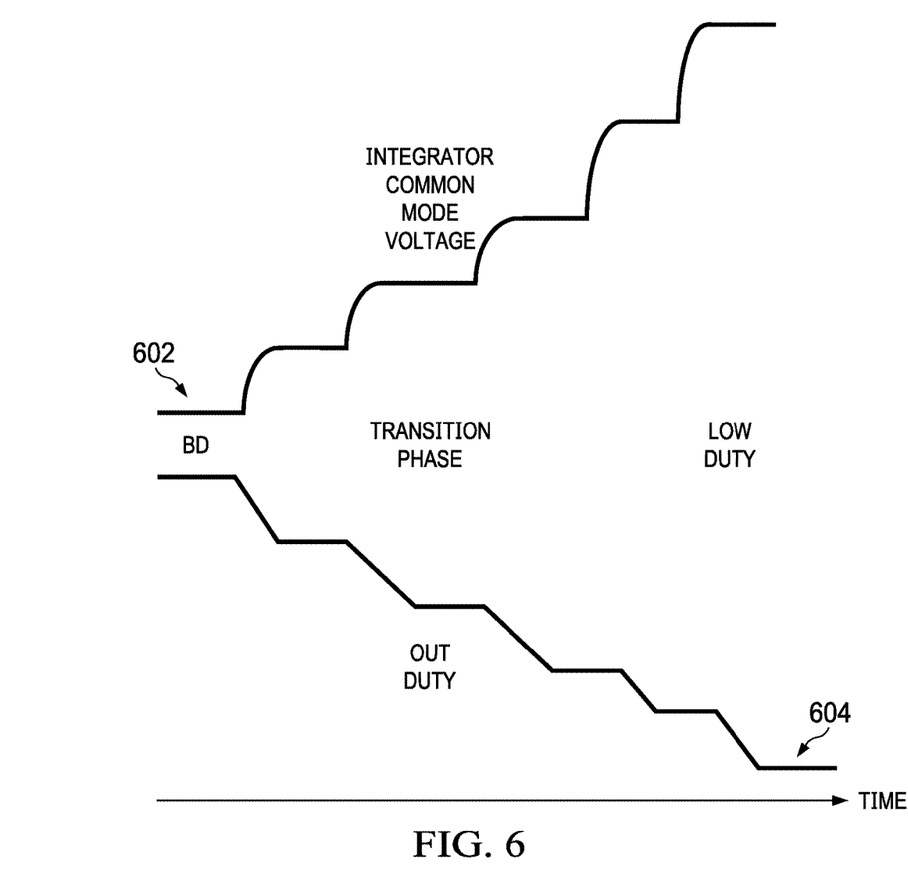
FIG. 6 shows changes in average duty cycle of a class-D amplifier output signal and integrator common mode voltage as the duty cycle transitions from high to low in a class-D amplifier in accordance with various embodiments.

FIG. 6 shows changes in average duty cycle of the amplifier 100 and integrator output common mode voltage as the average duty cycle transitions from high to low in the amplifier 100. At time 602, the duty cycle control circuitry 102 is inducing a low common mode voltage on the output of the integrator(s) 104. As a result, the average output duty cycle of the amplifier 100 is high (e.g., 50%, BD mode operation). Responsive to a lower audio signal amplitude, the duty cycle control circuitry 102 determines that the average duty cycle is to be reduced, and in turn increases the common mode voltage on the output of the integrator(s) 104 in a series of steps. Each step may correspond to a change in output common mode control provided to the integrator(s) 102 by the duty cycle control circuitry 102. Each step increase in common mode voltage output of the integrator(s) 104 produces a step reduction in average output duty cycle until the output common mode voltage of the integrator(s) 104 produces the desired low average output duty cycle at the output of the driver 106 at time 604. In similar fashion, the duty cycle control circuitry 102 can increase the average output duty cycle by stepwise decreasing the output common mode voltage of the integrator(s) 104. By gradually stepwise increasing or decreasing the average output duty cycle, the duty cycle control circuitry 102 reduces the incidence of transients in the output audio that may take the form of pops or clicks.

Figure 7:
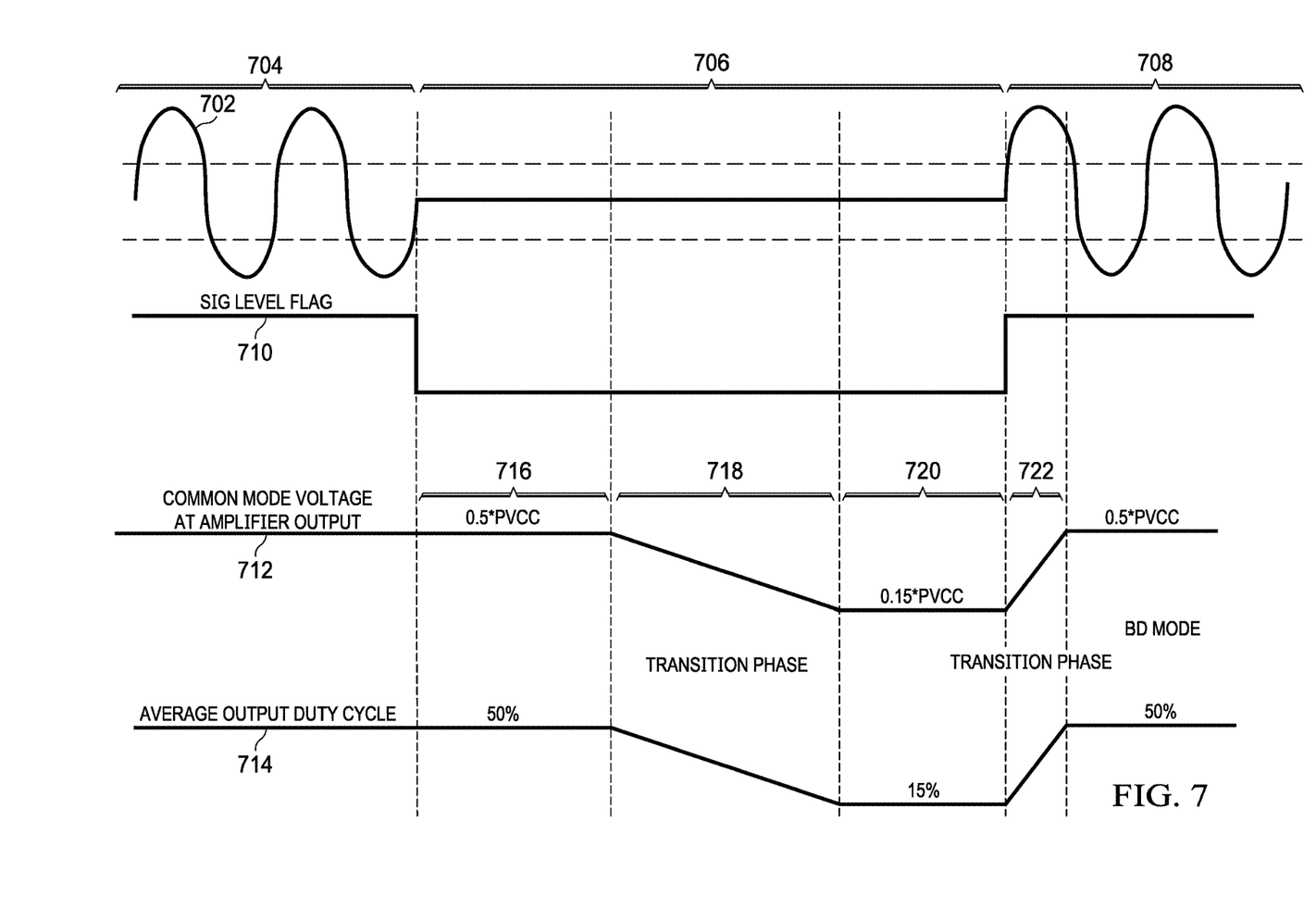
FIG. 7 shows change in output duty cycle and output common mode voltage responsive to changes in signal amplitude in a class-D amplifier in accordance with various embodiments.

FIG. 7 shows change in average output duty cycle and amplifier output common mode voltage responsive to changes in audio signal amplitude in the class-D amplifier 100. In FIG. 7, the audio signal 702 is high amplitude in interval 704. The signal amplitude decreases to a low level in interval 706 and returns to a high level in interval 708. Because the amplitude of the audio signal 702 is high in interval 704, the average output duty cycle 714 of the amplifier 100 is high and common mode voltage 712 at the output of the amplifier 100 is high. When the amplitude of the audio signal 702 drops to a low level in interval 706, the duty cycle control circuitry 102 detects the amplitude reduction. For example, the thresholding circuitry 204 determines that the amplitude of the audio signal 702 is less than a threshold voltage. Signal 710 represents comparison of the amplitude of the signal 702 to a threshold voltage. Responsive to the reduction in amplitude, the duty cycle control circuitry 102 may monitor the amplitude of the audio signal in interval 716 to ensure that the reduction in signal amplitude is not transient. In interval 718, the duty cycle control circuitry 102 provides a control signal to the integrator(s) 104 that gradually (e.g., in a series of steps) reduces the average output duty cycle 714 and output common mode voltage 712 of the amplifier 100. In interval 720, the average output duty cycle 714 has been reduced to a low value (e.g., 15%), with a corresponding reduction in output common mode voltage 712.

When the amplitude of the audio signal 702 increases in interval 708, the duty cycle control circuitry 102 detects the amplitude increase, and triggers an increase in the average output duty cycle 714 of the amplifier 100 to prevent clipping. Accordingly, in interval 722, the duty cycle control circuitry 102 provides a control signal to the integrator(s) 104 that increases the average output duty cycle 714 (which in turn increases the output common mode voltage 712) of the amplifier 100 until the average output duty cycle 714 has been increased to a high value (e.g., 50%), with a corresponding increase in output common mode voltage 712.

Figure 8:
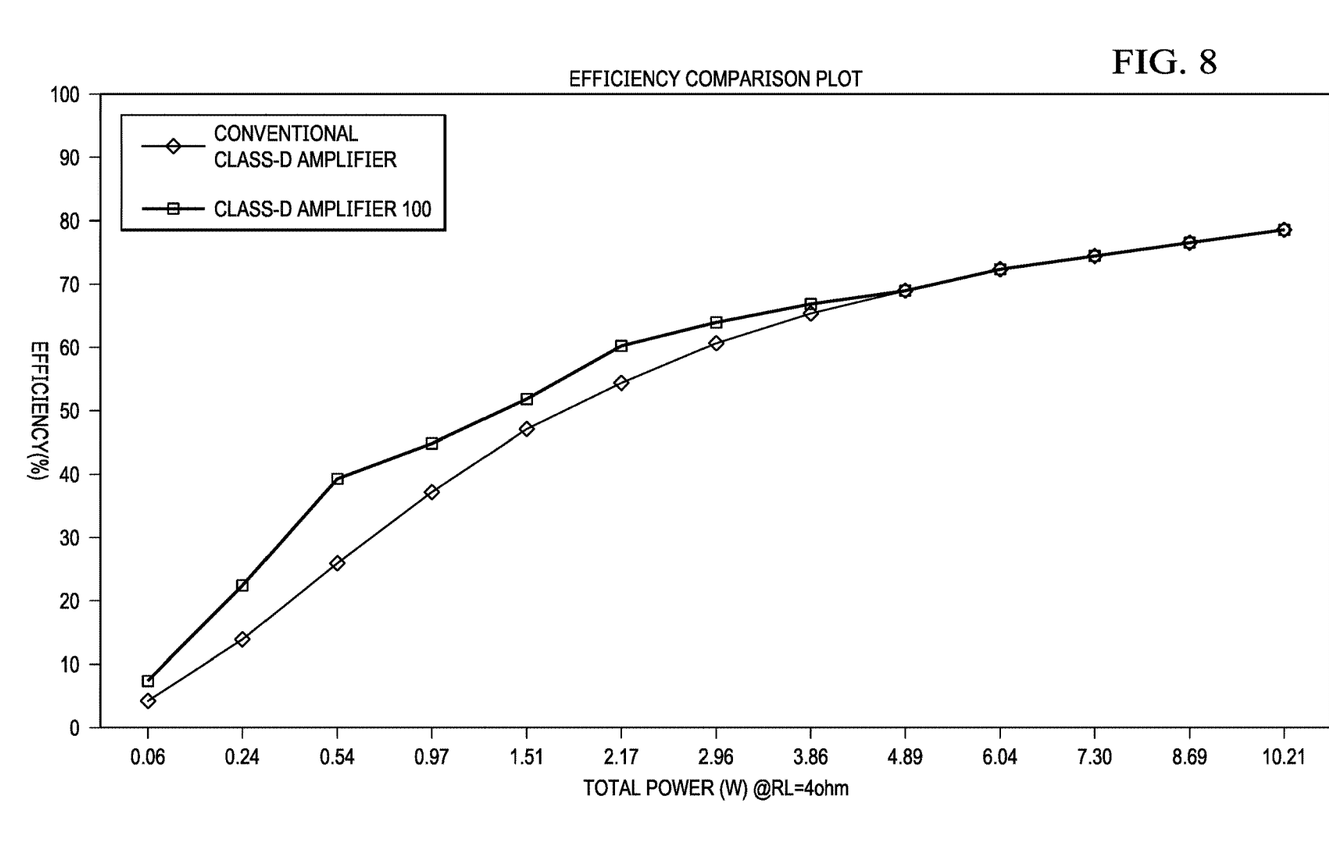
FIG. 8 shows efficiency of a controllable duty cycle versus a fixed duty cycle class-D amplifier.

FIG. 8 shows efficiency of the class-D amplifier 100 versus a conventional fixed duty cycle class-D amplifier. As shown in FIG. 8, the output duty cycle control circuitry 102 of the amplifier 100 provides a significant improvement in power efficiency at lower signal powers (e.g., lower audio signal amplitudes) relative to conventional class-D amplifiers that employ a fixed output duty cycle.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. An integrated circuit, comprising:
  a class-D audio amplifier, comprising:
    an output driver comprising an H-bridge configured to drive a loudspeaker;
    a pulse width modulator configured to provide input to the output driver;
    an integrator configured to provide input to the pulse width modulator; and
    duty cycle control circuitry coupled to the integrator, the duty cycle control circuitry comprising:
      thresholding circuitry comprising:

a first comparator coupled an output of the integrator, the first comparator is configured to compare amplitude of signal output by the integrator to a first threshold value; and a second comparator is coupled the output of the integrator, the second comparator is configured to compare the amplitude to a second threshold value;

wherein the first threshold is higher than the second threshold;

a comparing circuit coupled to the thresholding circuitry and configured to determine, based on outputs of the first comparator and the second comparator, whether an average duty cycle of signal at an output of the output driver is to be changed;

duty cycle adjustment circuitry coupled to the comparing circuit and configured to change the average duty cycle based on an output of the comparing circuit;

wherein the average duty cycle is an average of a duty cycle of signal produced at a first loudspeaker drive terminal of the H-bridge and a signal produced at a second loudspeaker drive terminal of the H-bridge.

2. The integrated circuit of claim 1, wherein the comparing circuit is configured to:

reduce the average duty cycle based on the amplitude being below the first threshold; and increase the average duty cycle based on the amplitude being above the second threshold.

3. The integrated circuit of claim 1, wherein the duty cycle adjustment circuitry is configured to:

responsive to a signal from the comparing circuit to increase the average duty cycle increase the average duty cycle at a first rate; and responsive to a signal from the comparing circuit to decrease the average duty cycle decrease the average duty cycle at a second rate;

wherein the first rate is higher than the second rate.

4. The integrated circuit of claim 1, wherein the duty cycle adjustment circuitry is configured to:

responsive to a determination by the comparing circuit to increase the average duty cycle, increase the average duty cycle in a plurality of steps, wherein each of the steps successively increases the average duty cycle; and responsive to a determination by the comparing circuit to decrease the average duty cycle, decrease the average duty cycle in a plurality of steps, wherein each of the steps successively decreases the average duty cycle;

wherein a number of steps applied to increase the average duty cycle by a given amount is fewer than a number of steps applied to decrease the average duty cycle by the given amount.

* * * * *